United States Patent [19]
Vandegraaf

[11] Patent Number: 5,146,187
[45] Date of Patent: Sep. 8, 1992

[54] SYNTHESIZER LOOP FILTER FOR SCANNING RECEIVERS

[75] Inventor: Johannes J. Vandegraaf, Lynchburg, Va.

[73] Assignee: Ericsson GE Mobile Communications Inc., Lynchburg, Va.

[21] Appl. No.: 723,956

[22] Filed: Jul. 1, 1991

[51] Int. Cl.$^5$ ............................................. H03L 7/107
[52] U.S. Cl. ........................................ 331/17; 331/16; 331/25; 333/174
[58] Field of Search ................. 331/4, 10, 16, 17, 18, 331/25, DIG. 2; 333/174

[56] References Cited

U.S. PATENT DOCUMENTS

| | | | |
|---|---|---|---|
| 4,007,429 | 2/1977 | Cadalora et al. | 331/17 |
| 4,135,165 | 1/1979 | Coe | 331/11 |
| 4,167,711 | 9/1979 | Smoot | 331/17 |
| 4,336,616 | 6/1982 | Carson et al. | 455/202 |
| 4,484,358 | 11/1984 | Iwahashi | 455/213 |
| 4,516,083 | 5/1985 | Turney | 331/1 A |
| 4,524,333 | 6/1985 | Iwata et al. | 331/17 |
| 4,525,686 | 6/1985 | Yokoya | 331/17 |
| 4,546,329 | 10/1985 | Unger | 331/DIG. 2 X |
| 4,559,505 | 12/1985 | Suarez et al. | 331/1 A |
| 4,587,496 | 5/1986 | Wolaver | 331/1 A |
| 4,714,899 | 12/1987 | Kurtzman et al. | 331/1 A |
| 4,745,371 | 5/1988 | Haine | 331/1 A |
| 4,752,749 | 6/1988 | Moger | 331/17 |
| 4,885,553 | 12/1989 | Hietala et al. | 331/17 |
| 4,912,434 | 3/1990 | Wyatt | 331/17 |
| 4,937,538 | 6/1990 | Hovens | 331/17 |
| 4,980,652 | 12/1990 | Tarusawa et al. | 331/1 A |
| 4,980,653 | 12/1990 | Shepherd | 331/16 |

FOREIGN PATENT DOCUMENTS

| | | | |
|---|---|---|---|
| 0134126 | 6/1986 | Japan | 331/DIG. 2 |
| 0134127 | 6/1986 | Japan | 331/DIG. 2 |

*Primary Examiner*—David Mis
*Attorney, Agent, or Firm*—Nixon & Vanderhye

[57] ABSTRACT

An improved adaptive loop lag filter for phase locked loop frequency synthesizers used in scanning receivers includes an additional resistor controllably inserted into the lag filter by a series-coupled C-MOS switch. The filter can be operated in an intermediate bandwidth mode. Switching to an intermediate bandwidth mode from the wide bandwidth mode before switching to a narrow bandwidth mode reduces the magnitude and duration of disturbances at the VCO output during bandwidth switching and promotes rapid settling of the synthesizer. The improved filter also includes a capacitor coupled between the output of the series-coupled switch and a signal ground to further attenuate any switching transients.

17 Claims, 3 Drawing Sheets

Fig. 3

| BANDWIDTH CONTROL INPUTS | | STATE (1=HIGH, 0=LOW) | |
|---|---|---|---|
| A | 1 | WIDE | |
| B | 1 | BANDWIDTH | |
| A | 0 | INTERMEDIATE | |
| B | 1 | BANDWIDTH | |
| A | 0 | NARROW | |
| B | 0 | BANDWIDTH | |

SYNTHESIZER LOOP FILTER FOR SCANNING RECEIVERS

FIELD OF THE INVENTION

The present invention relates generally to frequency synthesizers, and more particularly, to an improved multiple bandwidth adaptive loop lag filter for use in scanning receivers containing a phase-locked loop frequency synthesizer.

BACKGROUND AND SUMMARY OF THE INVENTION

Phase-locked loop (PLL) frequency synthesizers are commonly used in radio frequency transmitter and receiver circuits to produce a stable, precise, and selectably variable frequency source. A typical single loop PLL synthesizer includes a divided down stable reference frequency source, a voltage controlled oscillator (VCO) for producing an output signal having a controlled frequency, a frequency divider for dividing down the VCO output, a phase comparator for detecting the phase difference between the two divided down frequencies of the VCO and stable reference source, and for producing an error signal for representing the detected phase differences, and a loop filter for filtering the error signal and coupling it to the VCO to adjust the synthesizer's output frequency. The loop filter following the phase comparator is needed to reduce spurious frequency modulation of the VCO output produced by harmonics of the final comparison frequency and by the noise generated from the dividers in the phase detector. The divided down frequencies of the VCO and the stable reference source are phase-compared in the phase comparator. The output of the comparator is low-pass filtered in a loop filter and used to control the frequency of a VCO in order to lock the VCO output frequency to the reference source.

For this type of single loop PLL configuration, the relationship between the VCO output frequency, $F_{vco}$, and the reference source, $F_{ref}$, is given by the following equation:

$$F_{vco} = M/N \times F_{ref}$$

where M and N are the divider ratios of the respective frequency dividers.

It is also known to utilize an adjustable bandwidth type loop filter in frequency synthesizers to shorten the phase-lock frequency acquisition time and provide a more stable output signal. This is typically accomplished by switching a "lag filter" network in-to or out-of the loop filter circuit. Exemplary prior art configurations of this sort are disclosed in the following U.S. Pat. Nos.:

4,516,083 - Turney (1985)
4,524,333 - Iwata et al (1985)
4,559,505 - Suarez et al (1985)
4,714,899 - Kurtzman et al (1987)
4,980,653 - Shepard (1990)
4,525,686 - Yokoya (1985)
4,745,371 - Haine (1988)
4,885,553 - Hietala et al (1989)
4,937,538 - Hovens (1990)
4,980,652 - Tarosawa et al (1990)
4,484,358 - Iwahashi (1984)
4,336,616 - Carson et al (1982)
4,912,434 - Wyatt (1990)
4,135,165 - Coe (1979)
4,167,711 - Smoot (1979)
4,587,496 - Wolaver (1986)

In a scanning receiver, the frequency synthesizer is constantly reprogrammed to tune to a particular channel and to remain tuned to that channel if it is active, but otherwise, to proceed to the next channel or return to a home channel. It is desirable to accomplish this frequency hopping or scanning in as short a time as possible, therefore, necessitating rapid settling of the synthesizer output frequency. Moreover, to accommodate fast frequency changes, it is also desirable that the loop filter of the PLL frequency synthesizer initially have a wide bandwidth for quick acquisition of a desired frequency. Once frequency lock has been obtained, a PLL having a narrow bandwidth is desirable to attenuate noise and reference signal feed through. However, there are certain practical problems encountered in switching from a wide to narrow loop bandwidth. These have to do with the imperfections of the C-MOS switches commonly used in the loop lag filter to accomplish the bandwidth switching.

Typically, C-MOS switches gives rise to feedthrough transients imparted to the switched output by the control inputs and, introduce voltage transients that result in undesirable noise on the synthesizer output signal. These transients are especially bothersome when switching directly from the wide to a narrow bandwidth because the loop is then sluggish, and any disturbances at the output of the loop filter take an unacceptably long time to be regulated out. To reduce frequency disturbances caused by voltage transients during bandwidth switching, prior art PLL frequency synthesizers, such as described in U.S. Pat. No. 4,752,749 to Mayer (1988), neutralize or eliminate voltage differences across the output capacitor of the loop filter and the input to the VCO. In a similar approach, disclosed in U.S. Pat. No. 4,546,329 to Unger (1985), a transmission gate couples a resistance between the lag filter capacitors and signal ground to reduce transients during bandwidth switching. Other analogous prior art solutions to the switching transient problems are exemplified by U.S. Pat. Nos. 4,007,429 to Cadalora et al (1977) and 4,167,711 to Smoot (1979).

Although these prior art schemes reduce the effect of switching transients, they are complex, expensive to implement, and do not adequately eliminate transient generated instabilities. Moreover, whenever switching from the wide to the narrow bandwidth occurs, an extended duration transient is generated if the VCO is not exactly on frequency. It is advisable to reduce the system bandwidth initially only to the extent necessary for proper noise squelch operation (i.e, to get rid of comparison frequency harmonics). Once a useful signal is received, the bandwidth can be further reduced for normal (single channel) receiver operation. The present invention overcomes these inadequacies of the prior art solutions by providing a loop lag filter that has one or more intermediate bandwidths, and wherein the switching transients and any frequency kicks associated with switching between bandwidth modes is eliminated.

Briefly described, the present invention provides an improved loop lag filter for frequency synthesizers. As part of a synthesizer loop filter, the improved loop lag filter network includes a resistance which is controllably added into the filter by the use of a C-MOS switch during the wide bandwidth "acquisition" mode of the synthesizer's operation. This results in a change in the transfer function of the lag filter and a narrowing of its bandwidth to provide an intermediate bandwidth mode of operation. By first switching to an intermediate bandwidth, as opposed to switching directly to a narrow bandwidth, the magnitude and duration of any switching transients generated are considerably reduced. However, a short duration switching transient is still generated when the bandwidth is finally switched from the intermediate mode to its narrowest or "capture" mode. Although reduced, such a transient may be especially troublesome, if the VCO is frequency modulated with low-frequency, low-deviation tone or data, as is typical in tone squelch applications. Accordingly, the present invention provides a solution to this problem by incorporating an additional capacitor in the filter at the output terminal of the C-MOS switch (i.e., at the output of the switch that is used to add the resistance into the filter), to provide a low impedance path to signal ground. This capacitor combined with the voltage divider action provided by other resistors in the lag filter results in an almost total elimination of any frequency kick associated with bandwidth switching.

BRIEF DESCRIPTION OF THE DRAWINGS

These as well as other objects and advantages of this invention will be more completely understood and appreciated by carefully studying the following detailed description of a preferred embodiment taken in conjunction with the accompanying drawings, of which:

FIG. 3 is a graph showing the different transfer functions for the PLL bandwidth during three modes of operation of the lag filter circuit of FIG. 1.

DETAILED DESCRIPTION OF A PREFERRED EMBODIMENT

Figure 1:
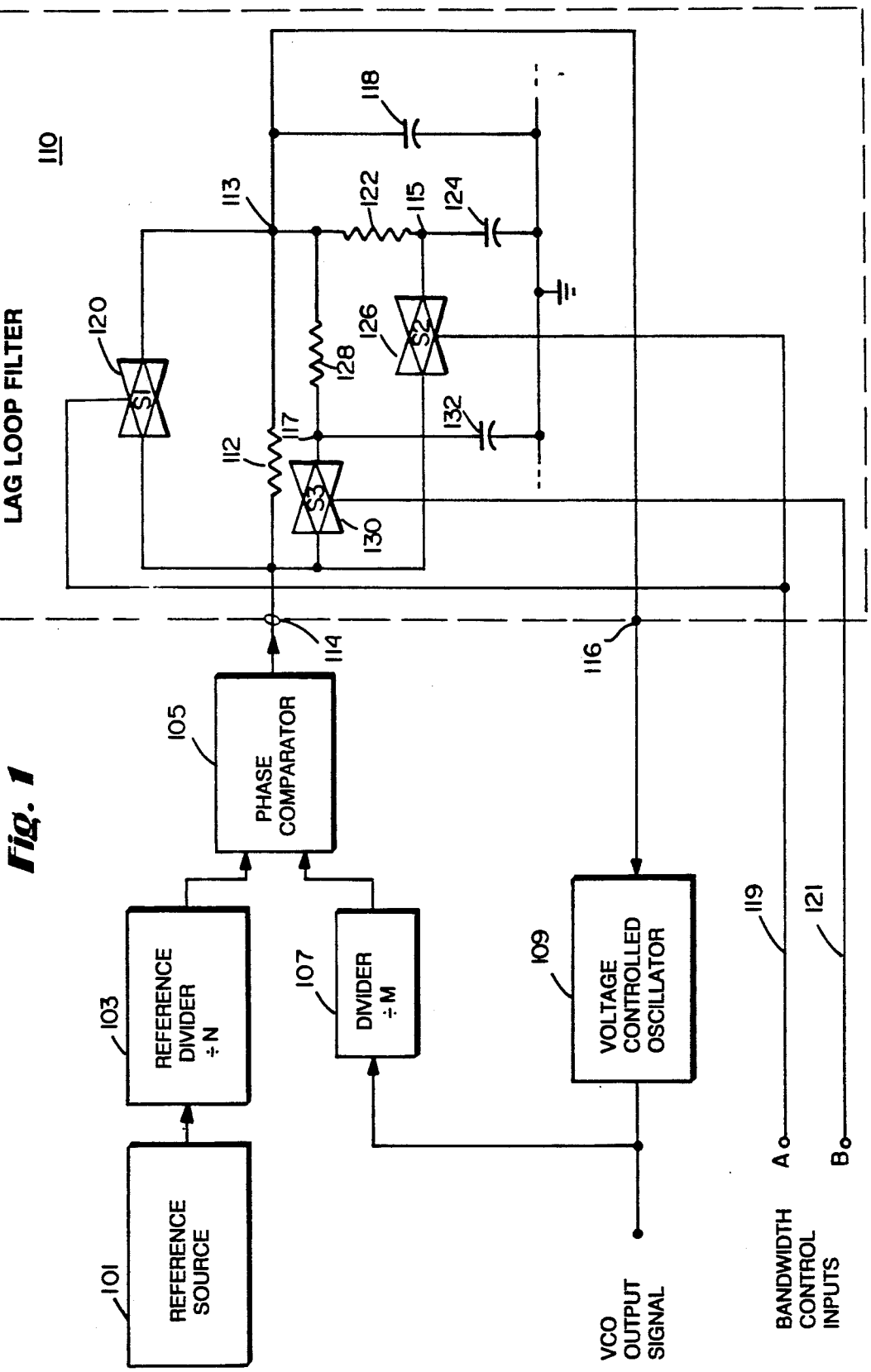
FIG. 1 is a schematic diagram of a PLL frequency synthesizer including a detailed circuit diagram of an adaptive loop lag filter in accordance with an embodiment of the present invention.

Referring to FIG. 1, there is illustrated a frequency synthesizer for a scanning receiver that includes an improved adaptive loop "lag" filter network 110 embodying the present invention. The lag filter 110 is responsive to bandwidth control signals for switching the loop bandwidth of the synthesizer between a wide bandwidth for rapid frequency acquisition, an intermediate bandwidth for reducing switching transients and eliminating any feed-through frequency harmonics, and a narrow bandwidth for precise frequency locking once a useful signal is being received. If so desired, an alternative embodiment may include additional switchable lag filter network stages of analogous design to provide two or more intermediate bandwidth modes of operation.

In addition to loop lag filter 110, the frequency synthesizer of FIG. 1 includes a voltage-controlled oscillator (VCO) 109 having its control input coupled to the output of the lag filter, a 1/M divider 107 coupled to the output of VCO 109, a reference frequency source 101 for providing a stable predetermined reference frequency signal, a 1/N reference frequency divider 103 coupled to a reference source 101 and a phase comparator 105 coupled to the outputs of reference divider 103 and divider 107. The output of the phase comparator 105 is coupled to input 114 of loop lag filter 110. The output signal provided by the synthesizer is obtained from the output of VCO 109 and may be used in the receiver circuitry of a scanning receiver to improve rapid signal acquisition.

In the preferred embodiment, the lag filter bandwidth is reduced from a wide acquisition mode to an intermediate bandwidth enough to avoid "comparison" frequency harmonics but still allow proper noise squelch operation. Once a useful signal is being received, the lag filter bandwidth is reduced, to its narrowest range in accordance with normal receiver operation.

The appropriate transfer function, H(S), for this type of filter when operating in its narrowest mode is given by the following equation $$H(s) \sim \frac{1 + sT1}{1 + sT2} \cdot \frac{1}{1 + sT3}$$

where,
T1=C1R2
T2=C1(R1+R2)
T3=C2R2
T1<<T2
T3<<T1
S=jw and C1 corresponds to the value of capacitor 124, C2 corresponds to the value of capacitor 118, R1 corresponds to the value of resistor 112, and R2 corresponds to the value of resistor 122. As such, the overall open loop response, K(S), for a frequency synthesizer using this type of filter is given by the equation below:

$$K(S) = \frac{K}{S} \cdot \frac{1 + sT1}{1 + sT2} \cdot \frac{1}{1 + sT3}$$

Figure 2:
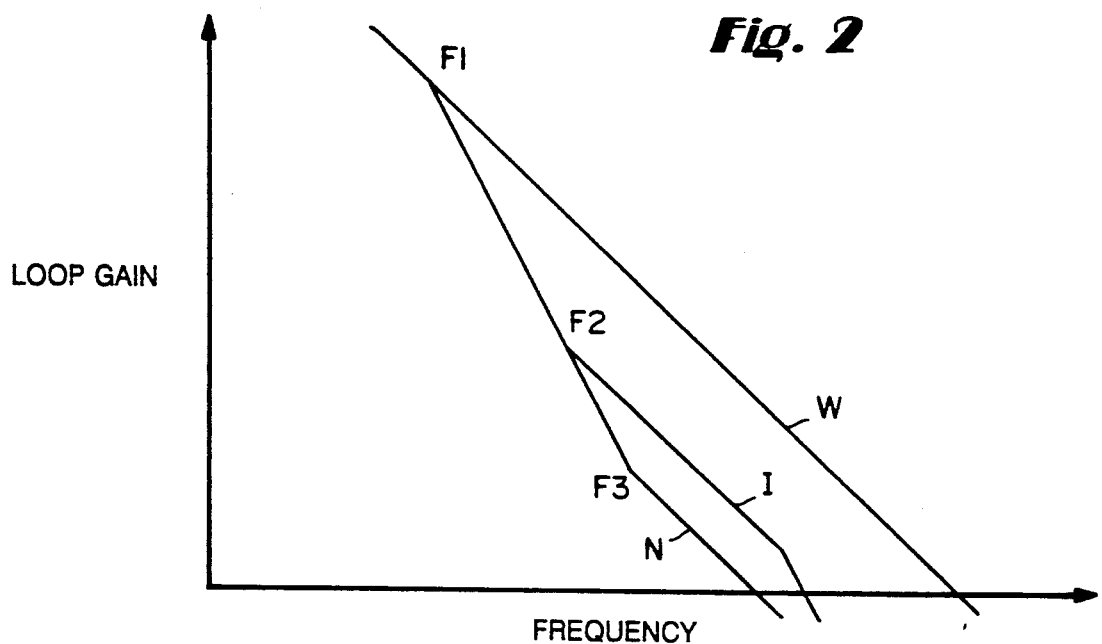
FIG. 2 depicts a state table showing the required bandwidth control input signal states for switching the loop filter between wide, intermediate, and narrow bandwidths.

The manner in which the transfer function for the synthesizer's bandwidth is changed by the operation of the present invention is depicted in FIG. 2. The narrow bandwidth response, K(S), plotted with the gain as a function of frequency, is shown as curve N. During this narrow bandwidth mode of operation, the transfer function curve N exhibits frequency corners at F1 and F2.

During wideband operation, the gain as a function of frequency is represented by line W. However, during intermediate bandwidth operation, the transfer function is represented by curve I, which exhibits two frequency corners at F3 and F4.

In the adaptive lag filter network, 110, resistor 112 is coupled between the filter input 114 and output 116. Capacitor 118 is coupled between filter output 116 at node 113 and a signal ground. A first switch S1 120 is coupled in parallel across resistor 112 and shunts lag filter network 110 between input 114 and output 116 at node 113. Coupled in a parallel across capacitor 118, between output 116 at node 113 and a signal ground, are a series-coupled second resistor 122 and second capacitor 124. A second switch S2 126 is coupled between input 114 and node 115 common to series-coupled resistor 122 and capacitor 124.

To provide an improved adaptive lag filter having an intermediate bandwidth mode of operation, the present invention includes a third switch S3 130 and a third resistor 128 that are series-coupled between filter input 114 and output 116, at node 113, and in parallel across resistor 112. Additionally, a third capacitor 132 is coupled between a signal ground and node 117, common to series-coupled resistor 128 and switch 130. In the preferred embodiment of the present invention, switches 120, 126, and 130, although shown functionally as blocks, are C-MOS transmission gates which are commonly used for bandwidth switching. Switching of the transmission gates between opened and closed states is accomplished in accordance with a high or low signal applied to their control inputs, as is well known in the art. In the preferred embodiment, the actual bandwidth switching is accomplished by providing high or low logic-level signals to the bandwidth control input lines 119 and 121 to alter the states of switches 120, 126, and 130.

The synthesizer, as depicted in FIG. 1, has three distinct operational states, a fast-tuning wide-bandwidth or acquisition mode, an intermediate bandwidth mode, and a narrow or tracking mode. For applications such as the scanning receivers, the synthesizer is constantly reprogrammed to a new frequency. As the synthesizer adjusts to each new frequency, the following sequence of events occur. First, at the start of signal acquisition, during the fast tuning "acquisition" mode, switches 120, 126, and 130 are closed, thus effectively shorting the lag network 110 out the circuit, assuring maximum loop bandwidth. Second, after an initial acquisition delay interval, to provide the VCO time to get approximately on frequency, switches 120 and 126 are opened and the synthesizer loop bandwidth is reduced to an intermediate bandwidth mode of operation. The desired intermediate bandwidth is typically not any narrower than that which is necessary for proper noise squelch operation (i.e., to eliminate feed-through and comparison frequency harmonics). Next, the VCO continues to zero-in further as the receiver looks for a signal. Finally, once a useful signal is being received, switch 130 is opened to further reduce the bandwidth to the synthesizer's narrow bandwidth or "capture" mode of operation which provides optimum noise performance.

The process of switching to an intermediate bandwidth has the important benefit of reducing the amplitude and shortening the duration of the switching transient, typically generated when switching from a wide to a narrow bandwidth. When the bandwidth is switched from the intermediate mode to the narrow mode, a final, albeit, reduced switching transient is still present. By incorporating additional capacitor 132 in the filter at the output of switch 130, the transient associated with the opening of switch 130 can be greatly reduced. Since a low impedance to ground is created at the output terminal of switch 130 by capacitor 132, the magnitude of any switching transient voltage spike is significantly reduced. Moreover, this transient disturbance is further reduced by the divider action of resistors 128 and 122. This combined action results in an almost total elimination of the frequency kick associated with bandwidth switching, provided the capacitance of capacitor 132 is made sufficiently large. Although the series combination of resistor 128 and capacitor 132 being in parallel with the series-coupled resistor/capacitor combination 122, 124 causes some change in the loop filter parameters, this can be accommodated in the overall design.

FIG. 3 shows the signal states for bandwidth control inputs A and B which are required to switch the improved loop lag filter of the present invention between wide, intermediate and narrow bandwidth modes of operations. Typically, these signals may be generated by a microprocessor controller or by simple digital logic circuitry.

Figure 4:
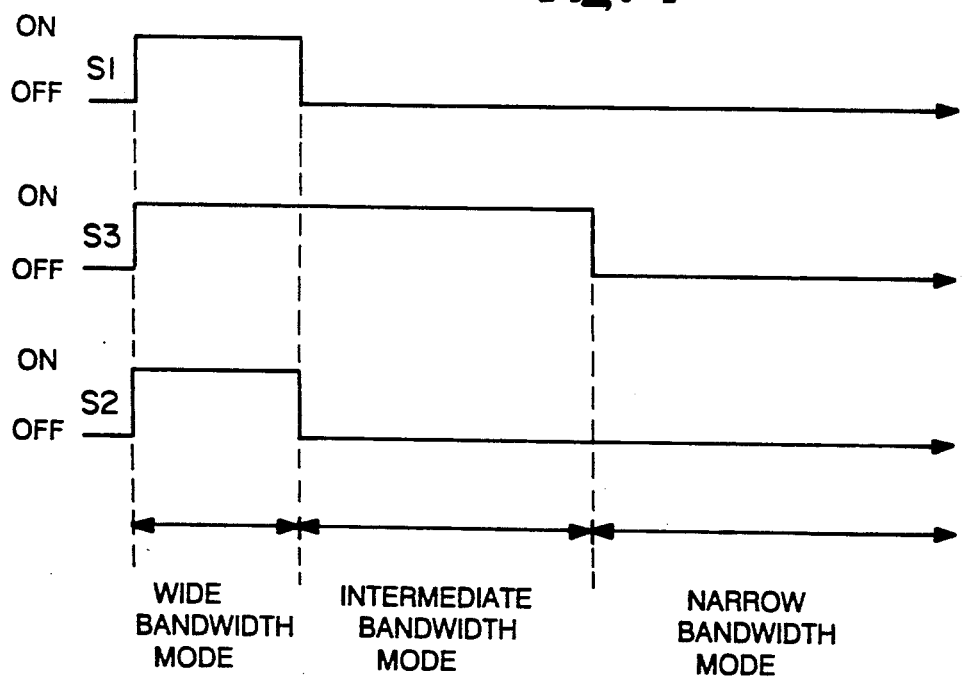
FIG. 4 is a relational timing diagram for the on/off states of the controlled switches of the lag filter of FIG. 1.

FIG. 4 depicts a generalized timing diagram showing the relative on and off states for three loop lag filter switches S1, S2, and S3, corresponding to switches 120, 126, and 130 in FIG. 1. The relative durations of on-off times for each switch somewhat flexible, and will depend on the particular application and operational criteria desired for the synthesizer. For example, the opening of the switch S3 can be made conditional on the achievement of successful tone or digital squelch decode by appropriately selecting the duration of the intermediate bandwidth mode. The VCO phase noise can thus be kept low enough to assure demodulation of low deviation tone or digital squelch modulation while not unduly compromising the settling of the VCO frequency. After the tone squelch circuitry makes the received audio available, the synthesizer loop bandwidth is then reduced to its narrow bandwidth mode of operation for improved noise performance.

Although the preferred embodiment of the present invention is described above as contemplated for use in scanning receivers, it should not be interpreted as limited to such applications, as it will prove advantageous in any frequency synthesizer application where rapid settling and good noise performance is essential (e.g., transmitter and receivers that operate in an intermittent or power saving mode). While the invention has been described in connection with what is presently considered to be the most practical and preferred embodiment, it is to be understood that the invention is not to be limited to the disclosed embodiment, but covers various modifications and equivalent arrangements included within the spirit and scope of the appended claims.

What is claimed is:

1. In a phase locked loop frequency synthesizer, a bandwidth alterable lag filter network having an input and an output, comprising:
    a bandwidth alterable RC filter means for restricting inputted signals to either a broad bandwidth or a narrow bandwidth coupled between the input and the output;
    a bandwidth reduction means for reducing the bandwidth of said RC filter to an intermediate bandwidth, said intermediate bandwidth being narrower than said broad bandwidth but broader than said narrow bandwidth, coupled between the input and the output and across said bandwidth alterable filter; and
    switch means for selectively coupling and decoupling said bandwidth reduction means from said input to alter the bandwidth of said alterable filter.

2. In a phase locked loop frequency synthesizer, a bandwidth alterable lag filter network as in claim 1, wherein said switch means is coupled directly to the input.

3. In a phase locked loop frequency synthesizer a lag filter network as in claim 1, further comprising:
    a first capacitor coupled between the output of said switch means and a signal ground of said RC filter.

4. In a phase locked loop frequency synthesizer, a lag filter network as in claim 1 wherein said switch means is a C-MOS transmission gate.

5. In a phase locked loop frequency synthesizer, a lag filter network as in claim 1 wherein said capacitor has an electrical capacitance of substantially greater value than of that used in said RC filter.

6. In a phase locked loop frequency synthesizer, a bandwidth alterable lag filter circuit as in claim 1 wherein said switch is a C-MOS transmission gate.

7. In a phase locked loop frequency synthesizer, a bandwidth alterable lag filter circuit having an input and a signal ground, comprising:
   a bandwidth alterable RC filter circuit capable of operating in at least three distinct bandwidth ranges coupled between the input and said signal ground;
   a first resistor coupled between the input and the output and across the low-pass filter; and
   a switch for selectively coupling and decoupling the resistor from the low-pass filter to alter the bandwidth of the lag filter.

8. In a phase locked loop frequency synthesizer, a bandwidth alterable lag filter circuit as in claim 7, wherein said switch is coupled directly to the input.

9. In a phase locked loop frequency synthesizer, a bandwidth alterable lag filter circuit as in claim 7, further comprising:
   a first capacitor coupled between the output of said switch and said signal ground.

10. In a phase locked loop frequency synthesizer, a bandwidth alterable lag filter circuit as in claim 7 wherein said first capacitor has an electrical capacitance of substantially greater value than that used in said low-pass filter.

11. A lag filter network for use in a loop filter in a phase locked loop frequency synthesizer comprising:
   input means coupled to the loop;
   an output means coupled to said loop;
   a first resistive means coupled between the input means and output means;
   a first switching means coupled in parallel with the first resistive means;
   a first capacitive means coupled between the output means and a signal ground;
   a second resistive means and a second capacitive means series-coupled between the output means and said signal ground;
   a second switching means coupled between the input means and a common node between said series-coupled second resistive and second capacitive means;
   a third resistive means and a third capacitive means series-coupled between the output means and said signal ground;
   a third switching means coupled between the input means and a common node between said series-coupled third resistive and third capacitive means.

12. The lag filter network as set forth in claim 11 wherein said first, second and third switching means are C-MOS transmission gates.

13. A lag filter network having an input, an output and an electrical circuit ground for use in a loop filter in a phase locked loop frequency synthesizer, comprising:
   a first switch coupled between the input and the output;
   a first resistor coupled in parallel with the first switch and between the input and the output;
   a first capacitor coupled between the output and the circuit ground;
   a second resistor and a second capacitor series-coupled between the output and the circuit ground;
   a second switch coupled between the input and a common node between said series-coupled second resistor and second capacitor;
   a third resistor and a third capacitor series-coupled between the output and the circuit ground;
   a third switch coupled between the input and common node between said series-coupled third resistor and third capacitor.

14. The lag filter network as set forth in claim 13 wherein said first, second and third switches are C-MOS transmission gates.

15. A method of providing at least one intermediate frequency bandwidth mode of operation in a phase lock loop frequency synthesizer, said phase locked loop including a voltage controlled oscillator coupled to the output of a loop filter, the loop filter comprising a bandwidth alterable lag filter having at least one bandwidth altering resistor, and a voltage transient suppression capacitor, connected to said resistor comprising the step of:
   switching from a wide bandwidth mode of operation to an intermediate frequency bandwidth mode of operation by electrically coupling said resistor and said capacitor into the lag filter network.

16. A method of providing at least one intermediate bandwidth mode of operation in a phase lock loop frequency synthesizer as described in claim 15 further comprising the step of:
   simultaneously decoupling said resistor and said voltage transient suppression capacitor from an input of said lag filter when switching from an intermediate frequency bandwidth to a narrower frequency bandwidth.

17. A method of providing a wide bandwidth mode of operation, a narrow bandwidth mode of operation and at least one intermediate frequency bandwidth mode of operation in an adaptive phase lock loop frequency synthesizer without creating substantial switching transients which disturb the output signal, the phase locked loop including a voltage controlled oscillator coupled to the output of a loop filter, said loop filter comprising a bandwidth alterable lag filter network having a low-pass filter network comprising at least one first controllable switch and at least one bandwidth altering resistor, an additional second controllable switch coupled to an input of said loop filter and in series with said bandwidth altering resistor, and a voltage transient suppression capacitor coupled between an output of said second controllable switch and a circuit ground of said lag filter, comprising the steps of:
   electrically bypassing the low-pass filter by setting the state of said at least one first controllable switch in the low-pass filter network to provide a wide bandwidth mode of operation;
   changing the state of said at least one first controllable switch to effectively couple said low-pass filter including said extraneous resistor and capacitor into the lag filter network to provide an intermediate frequency bandwidth mode of operation; and
   subsequently changing the state of the second controllable switch to electrically rearrange said bandwidth altering resistor within the low pass filter to provide a narrow bandwidth mode of operation.

* * * * *